United States Patent
Ukigai et al.

(10) Patent No.: US 10,029,233 B2
(45) Date of Patent: Jul. 24, 2018

(54) WET AREA MEMBER

(71) Applicant: Toto, Ltd., Fukuoka (JP)

(72) Inventors: Saori Ukigai, Kitakyushi (JP);
Hironori Hatono, Kitakyushi (JP);
Atsushi Teramoto, Kitakyushi (JP);
Mayui Noborisaka, Kitakyushi (JP);
Kazuhiro Ishikawa, Kitakyushi (JP);
Satoshi Shimizu, Kitakyushi (JP);
Nobuhiko Kanekuni, Kitakyushi (JP)

(73) Assignee: TOTO LTD., Fukuoka (JP)

( * ) Notice: Subject to any disclaimer, the term of this patent is extended or adjusted under 35 U.S.C. 154(b) by 55 days.

(21) Appl. No.: 15/049,269

(22) Filed: Feb. 22, 2016

(65) Prior Publication Data

US 2016/0243520 A1    Aug. 25, 2016

(30) Foreign Application Priority Data

Feb. 23, 2015   (JP) ................ 2015-032649
Feb. 23, 2015   (JP) ................ 2015-032650

(51) Int. Cl.
| | |
|---|---|
| C23C 16/26 | (2006.01) |
| B01J 20/20 | (2006.01) |
| C23C 16/02 | (2006.01) |
| C23C 16/27 | (2006.01) |
| B05D 1/00 | (2006.01) |

(52) U.S. Cl.
CPC ......... B01J 20/20 (2013.01); B05D 1/62 (2013.01); C23C 16/0272 (2013.01); C23C 16/27 (2013.01)

(58) Field of Classification Search
USPC ................................. 428/408; 251/368
See application file for complete search history.

(56) References Cited

U.S. PATENT DOCUMENTS

| | | | | |
|---|---|---|---|---|
| 4,809,876 A | * | 3/1989 | Tomaswick | B29C 71/04 428/408 |
| 4,935,303 A | * | 6/1990 | Ikoma | C23C 16/26 428/408 |

(Continued)

FOREIGN PATENT DOCUMENTS

EP   1114881 A1   7/2001

OTHER PUBLICATIONS

Godet et al., "Structural and electronic properties of electron cyclotron resonance plasma deposited hydrogenated amorphous carbon and carbon nitride films," Journal of Applied Physics, 91(7):4154-4162 (2002).

(Continued)

*Primary Examiner* — Archene A Turner
(74) *Attorney, Agent, or Firm* — Marshall, Gerstein & Borun LLP

(57) ABSTRACT

Provided is a wet area member for use in an indoor wet environment, comprising: a base member; and an amorphous carbon layer formed on a surface of the base member and mainly containing carbon atoms, wherein the amorphous carbon layer further contains hydrogen atoms, and the amorphous carbon layer contains the hydrogen atoms in a predetermined amount or more and has a density lower than a predetermined value so as to be capable of inhibiting sticking of water scale for a long period. This makes it possible to obtain a wet area member which exhibits a high stain release property and a high stain release durability.

11 Claims, 2 Drawing Sheets

(56) References Cited

U.S. PATENT DOCUMENTS

| | | | |
|---|---|---|---|
| 5,100,565 A * | 3/1992 | Fujiwara | F16K 3/08 |
| | | | 251/368 |
| 6,572,935 B1 | 6/2003 | He et al. | |
| 6,652,969 B1 | 11/2003 | Murakami et al. | |
| 7,029,752 B2 * | 4/2006 | Hama | A61J 1/00 |
| | | | 428/408 |
| 2004/0245496 A1 * | 12/2004 | Taoda | C11D 3/0063 |
| | | | 252/186.1 |
| 2008/0199702 A1 * | 8/2008 | Murphy | C03C 17/3441 |
| | | | 428/408 |
| 2012/0231177 A1 | 9/2012 | Wei et al. | |

OTHER PUBLICATIONS

Search Report from European Application No. 16156355.6 dated Apr. 21, 2016.
Adliene et al., "Radiation induced changes in amorphous hydrogenated DLC films", Materials Science and Engineering, 152:91-95 (2008).
Manfredotti, et al. "CVD diamond microdosimeters," Nuclear Instruments and Methods in Physics Research, 458:360-364 (2001).
Robertson, "Diamond-like amorphous carbon," Materials Science and Engineering 37:129-281 (2002).

* cited by examiner

WET AREA MEMBER

TECHNICAL FIELD

The present invention relates to a wet area member in which an amorphous carbon layer is formed on a surface of a wet area base member and which is used in an indoor wet environment.

BACKGROUND ART

A base member used in a wet area (hereinafter, also referred to as a wet area base member) is used in an environment where water is present. Accordingly, water tends to adhere onto the surface of the wet area base member. A problem is known in which when the water adhering to the surface evaporates, water scale containing silica and calcium, which are components contained in tap water, is formed on the surface of the wet area base member. In addition, another problem is known in which stains of protein, sebum, mold, microorganisms, soap, and the like adhere or stick onto the surface of the wet area base member.

It is difficult to prevent the stains from adhering onto the surface of a wet area base member. Hence, ordinarily, the original state is restored by removing the stains on the surface by cleaning. Specifically, the stains are removed by an operation such as scrubbing of the surface of the wet area base member with a cloth or a sponge by using a detergent and tap water. A wet area base member is required to be easy to clean, i.e., is required to have a high stain release property.

Moreover, since a wet area base member is generally used for a long period, the stain release property is required to last for a long period, i.e., the wet area base member is required to have stain release durability. A wet area base member may be placed in a space with a window, and used in an environment where the wet area base member is irradiated indirectly with sunlight. Accordingly, such a wet area base member is required to exhibit stain release durability even in an environment where the wet area base member is irradiated with a trace amount of ultraviolet rays.

For the prevention of adherence of water scale or water-derived stains onto the surface of a wet area base member, the following technologies have been known. Japanese Patent Application Publication No. 2008-163362 (Patent Literature 1) describes a faucet on which a plating film is formed, wherein the plating film contains hydrophilic fine particles, and some of the hydrophilic fine particles partially protrude from the surface of the plating film. In addition, Patent Literature 1 states that since irregularities formed by the hydrophilic fine particles are present on the surface of the plating film, hydrophilicity is provided to the surface of the plating film to inhibit the adherence of water scale.

Japanese Patent Application Publication No. 2002-317298 (Patent Literature 2) states that a plating layer is formed on a surface of a base member, and the plating layer contains water-repellent particles made of a fluororesin. Patent Literature 2 states that water scale and the like become easy to remove, because the surface of the plating layer is made water-repellent.

Japanese Patent Application Publication No. 2014-202047 (Patent Literature 3) states that an amorphous carbon (DLC) layer is formed on a surface of a faucet, and the color difference due to the amorphous carbon (DLC) layer is limited to a specific range to retain the texture of the faucet.

On the other hand, prevention of adherence of rain-derived stains onto the surface of glass used outdoor has also been studied. Japanese Translation of PCT International Application Publication No. 2002-543035 (Patent Literature 4) states that an amorphous carbon (DLC) coating is provided on a soda inclusive glass substrate to reduce corrosion and stains on the glass substrate. Patent Literature 4 states that the amorphous carbon (DLC) coating includes at least one highly tetrahedral amorphous carbon (ta-C) layer, and that the highly tetrahedral amorphous carbon (ta-C) layer preferably has a high density and contains a high percentage of $sp^3$ carbon-carbon bonds.

Japanese Patent Application Publication No. 2000-72488 (Patent Literature 5) states that when a layer containing silicon as a main component and an amorphous carbon layer are formed in this order on a glass base member, attachment of inorganic stains becomes less likely to occur, or stains become easy to remove. In addition, Patent Literature 5 states that when the amorphous carbon layer contains hydrogen at 5 to 20 atomic % relative to the total amount of carbon and hydrogen, the hardness increases, the scratch-resistance is improved, and the weather-resistance is improved.

CITATION LIST

[Patent Literature 1] Japanese Patent Application Publication No. 2008-163362
[Patent Literature 2] Japanese Patent Application Publication No. 2002-317298
[Patent Literature 3] Japanese Patent Application Publication No. 2014-202047
[Patent Literature 4] Japanese Translation of PCT International Application Publication No. 2002-543035
[Patent Literature 5] Japanese Patent Application Publication No. 2000-72488

SUMMARY OF INVENTION

Technical Problems

Indoor wet area facilities in a bath room, a toilet room, a washroom, a kitchen, and the like are used multiple times every day, and are exposed to water every time the facilities are used. Since the facilities are used whenever necessary in active time, it is very difficult to keep the facilities always in a clean state, even when the facilities are cleaned frequently. Further, it may be difficult to clean the facilities frequently in some cases. In addition, most of the facilities are exchanged at the timing of reconstruction or the like, and hence used for long periods of 10 years or longer.

The above-described methods of Patent Literatures 1 and 2 have such a problem that it is not possible to prevent the formation of water scale on the surface of the wet area member in the case of an environment where the wet area member is frequently exposed to water. Moreover, the methods of Patent Literatures 1 and 2 have such a problem that when the amount of water scale formed on the surface of the wet area member increases, the stain release property cannot be obtained, and hence the stain release durability is low. Moreover, the method of Patent Literature 2 has such a problem that the hardness of the fluororesin is so low that when the surface of the wet area member is repeatedly rubbed, deterioration in stain release property and degradation of appearance occur, and hence the stain release durability is low.

Patent Literature 3 mentioned above states that an excellent appearance is obtained, but no consideration is taken to keep the stain release property for a long period.

The above-described methods of Patent Literatures 4 and 5 are not intended for an environment where the wet area member is exposed to water multiple times every day. In addition, no consideration is taken to keep the stain release property in such an environment for a long period.

Regarding these problems, it has been found in the present invention that an indoor wet area member having both a stain release property and a stain release durability can be obtained when an amorphous carbon layer is formed on a surface of the indoor wet area base member, and when the amorphous carbon layer contains hydrogen atoms in an amount more than a predetermined amount and has a density smaller than a predetermined value.

An object of the present invention is to obtain a wet area member which can exhibit both a stain release property and a stain release durability and which is used in an indoor wet environment.

Solution to Problems

The present invention provides a wet area member for use in an indoor wet environment. The wet area member comprises: a base member; and an amorphous carbon layer formed on a surface of the base member and mainly containing carbon atoms, wherein the amorphous carbon layer further contains hydrogen atoms, and the amorphous carbon layer contains the hydrogen atoms in a predetermined amount or more and has a density lower than a predetermined value so as to be capable of inhibiting sticking of water scale for a long period.

The present invention also provides a method for manufacturing the wet area member, the manufacturing method comprising the steps of: placing a wet area base member on a base member-supporting portion provided in a container; reducing the pressure in the container; introducing a raw material into the container and adjusting the pressure in the container to a predetermined pressure; generating a high-density plasma by generating a plasma from the raw material; applying a voltage to the base member-supporting portion; and forming an amorphous carbon layer on a surface of the wet area base member by depositing the high-density plasma onto the surface of the wet area base member.

Effects of the Invention

The present invention makes it possible to obtain an indoor wet area member which can exhibit both a stain release property and a stain release durability.

DESCRIPTION OF EMBODIMENTS

Hereinafter, the present invention will be described in detail.

Figure 1:
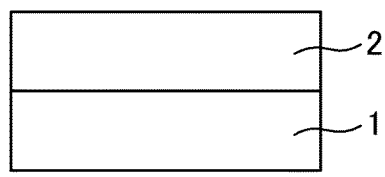
FIG. 1 is a schematic diagram showing a configuration in which an amorphous carbon layer is formed on a base member.
Figure 2:
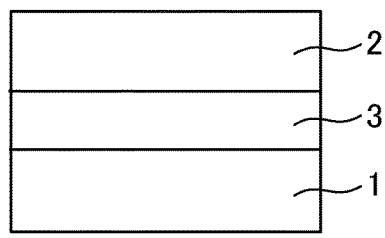
FIG. 2 is a schematic diagram showing a configuration in which an intermediate layer and an amorphous carbon layer are formed on a base member.

A wet area member of the present invention is one in which an amorphous carbon layer 2 is formed on a base member 1, as shown in FIG. 1. Alternatively, as shown in FIG. 2, the wet area member of the present invention may be one in which an intermediate layer 3 and the amorphous carbon layer 2 are formed on the base member 1.

The wet area member of the present invention is used in an indoor wet environment. The wet area member includes a base member and an amorphous carbon layer formed on a surface of the base member and mainly containing carbon atoms. The amorphous carbon layer further contains hydrogen atoms. The amorphous carbon layer contains the hydrogen atoms in a predetermined amount or more and has a density lower than a predetermined value so as to be capable of inhibiting sticking of water scale for a long period. This makes it possible to obtain both stain release property and stain release durability.

A member used in a wet area is gradually whitened because the silica component and the like in tap water adhere to a surface of a material as water scale. In the present invention, the "stain release property" refers to a property of allowing the water scale to be removed by light-duty cleaning (water scale removability at an initial stage).

Meanwhile, in the present invention, the "stain release durability" refers to a property of retaining the stain release property even under a situation simulating an indoor wet area environment, where the member is exposed to tap water for a long period, while being irradiated with a trace amount of ultraviolet rays (water scale removability over a long period).

In addition, the term "adhere" in the present invention refers to mainly physical attachment to a thing. The term "stick" refers to firm attachment to a thing, involving chemical bonding.

Base Member

The base member of the present invention is a wet area base member. The wet area base member is a base member used in a wet area. Materials which may constitute the wet area base member include metals, glass, pottery, resins, and the like. The wet area base member may be constituted of only one material or two or more materials. Surface characteristics of the wet area base member are not particularly limited, and a glossy mirror surface, a satin surface, a hairline surface, or the like may be applied.

The wet area where the wet area member of the present invention is used only needs to be a place where water is used, and may be used in a bath room, a washroom, a kitchen, a toilet room, or the like in a house or a public facility such as a park or a department store. Specifically, the wet area member is preferably used as a mirror, a wall, a floor, a door, a window, a faucet, a water drain, a drain plug, a shower head, a shower bar, a wall of a shower booth, a handrail, a kitchen counter, a kitchen sink, a drain, a bidet toilet, a lid for a bidet toilet, a nozzle of a bidet toilet, or the like. The wet area member of the present invention is more preferably used in a bath room. Specifically, the wet area member of the present invention is more preferably used as a mirror, a wall of a bath room, a floor of a bath room, a door of a bath room, a window of a bath room, a faucet, a water drain, a shower head, a shower bar, a handrail, or a drain. The wet area member of the present invention is further preferably used as a mirror, a wall of a bath room, a door of a bath room, a window of a bath room, a faucet, a shower head, a shower bar, or a handrail.

Amorphous Carbon Layer

In the present invention, the amorphous carbon layer contains an amorphous compound containing carbon atoms and hydrogen atoms. The amorphous carbon layer mainly contains carbon atoms. Here, the phrase "mainly contains carbon atoms" means that the amount of carbon atoms in the amorphous carbon layer is more than 50 atm %. The amount of carbon atoms in the amorphous carbon layer is more preferably 60 atm % or more.

Some of the carbon-carbon bonds contained in the amorphous carbon layer have a bonding state of the $sp^3$ structure, which is the diamond structure, and others have a bonding state of the $sp^2$ structure, which is the graphite structure. The content of the carbon-carbon bonds with the $sp^3$ structure in the amorphous carbon layer is preferably 10% or higher relative to the sum of the carbon-carbon bonds with the $sp^3$ structure and the carbon-carbon bonds with the $sp^2$ structure. The content is more preferably 20% or higher, and further more preferably 30% or higher. Increasing the content of carbon-carbon bonds with the $sp^3$ structure in the amorphous carbon layer makes it possible to increase the hardness of the amorphous carbon layer and lower the chemical reactivity of the amorphous carbon layer.

In the present invention, the amount of hydrogen atoms contained in the amorphous carbon layer is preferably more than 3 atm %. More preferably, the amount of hydrogen atoms is 21 atm % or more. This makes it possible to enhance the stain release property of the amorphous carbon layer. In addition, the amount of hydrogen atoms contained in the amorphous carbon layer is preferably less than 42 atm %, and is more preferably 35 atm % or less. This makes it possible to enhance the stain release durability of the amorphous carbon layer even in an environment where the amorphous carbon layer is irradiated with a trace amount of ultraviolet rays.

The reason why the amount of hydrogen atoms contained in the amorphous carbon layer of the present invention exerts influences on the stain release property and the stain release durability as described above is presumably as described below. However, the present invention is not limited to this mechanism of action.

It is conceivable that the amount of carbon atoms which are present in the amorphous carbon layer and are placed in unstable chemical bonding states can be reduced, because the amount of hydrogen atoms contained in the amorphous carbon layer is a specific amount or more. The carbon atoms placed in the unstable chemical bonding states mean carbon atoms each having a dangling bond or a distorted chemical bond. The carbon atoms in such states are presumably highly reactive with other chemical species. However, in the present invention, since the amount of hydrogen atoms contained in the amorphous carbon layer is a specific amount or more, the amount of carbon atoms which are present in the amorphous carbon layer and are placed in the unstable chemical bonding states can be reduced. Presumably, it is accordingly possible to reduce chemical reactions of substances such as stains in a wet environment with carbon atoms which are contained in the amorphous carbon layer and placed in the unstable chemical bonding states. Presumably for the above-described reason, it is possible to prevent sticking of stains to the surface of the amorphous carbon layer and obtain the stain release property.

In addition, when an amorphous carbon layer is irradiated with a trace amount of ultraviolet rays, carbon-carbon bonds in the amorphous carbon are cleaved to form new bonds with oxygen or water (carbon-oxygen bonds and carbon-hydrogen bonds). When the reactions proceed, bonds of some of the carbon atoms to the amorphous carbon layer are completely cleaved, and the carbon atoms are converted to low molecular weight compounds such as carbon dioxide and methane, and released from the amorphous carbon layer. As a result, the number of carbon atoms contained in the amorphous carbon layer decreases. In other words, the amorphous carbon layer gets thinner, and finally disappears. When the amount of hydrogen atoms contained in the amorphous carbon layer is less than a specific amount, the number of carbon-carbon bonds contained in the amorphous carbon layer can be increased. For this reason, even when the number of carbon atoms contained in the amorphous carbon layer slightly decreases because of the irradiation with a trace amount of ultraviolet rays, a sufficient number of carbon atoms are left. For this reason, the amorphous carbon layer can be prevented from disappearing. Presumably for this reason, it is possible to enhance the stain release durability in an environment where the amorphous carbon layer is irradiated with a trace amount of ultraviolet rays.

Determination of Amount of Hydrogen Atoms

Figure 3:
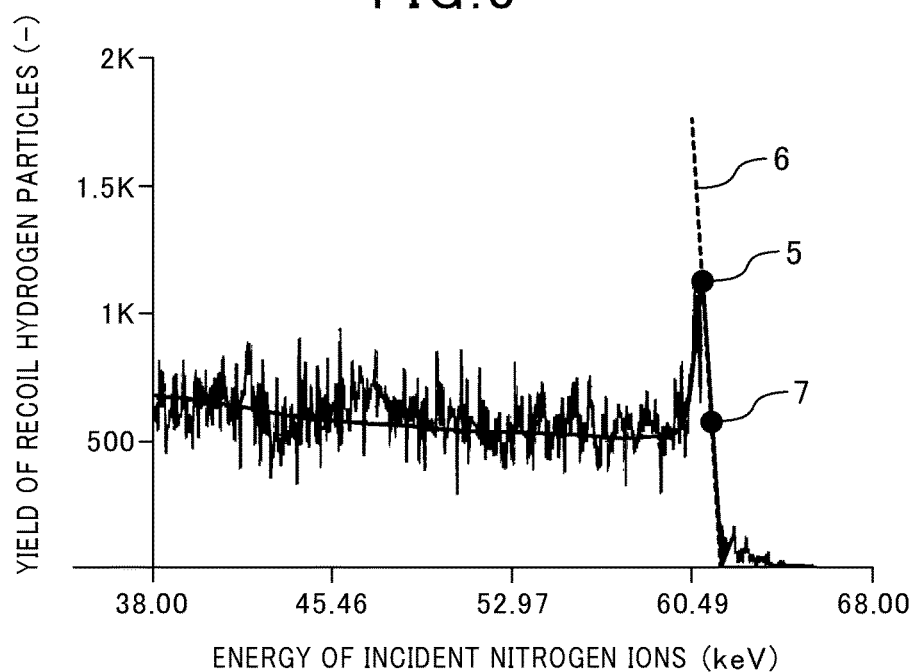
FIG. 3 shows an example of measurement data of an elastic recoil detection analysis.

The amount of hydrogen atoms contained in the amorphous carbon layer of the present invention is determined by elastic recoil detection analysis (hereinafter, referred to as ERDA). As measuring instruments, for example, a high-resolution RBS analyzer HRBS 1000 (manufactured by KOBELCO) can be used. Measurement conditions are as follows: acceleration voltage: 500 keV; ion species: nitrogen ion. The energy detection range of recoil hydrogen particles is from 38 keV to 68 keV. Measurement data are obtained under these conditions. FIG. 3 shows an example of the obtained measurement data. The measurement data are expressed in a graph in which the energy of incident nitrogen ions is plotted on the horizontal axis and the yield of the recoil hydrogen particles is plotted on the vertical axis. The obtained measurement data are analyzed by dedicated analysis software (for example, analysisIB manufactured by KOBELCO). The conditions of the analysis are as follows: change step size: 100; calculation times: 5000 times. The surface of an amorphous carbon layer is defined as follows. In a graph of measurement data as shown in FIG. 3, an approximate straight line 6 starting from a maximum point 5 of the yield of recoil hydrogen particles within the region where the energy of incident nitrogen ions is 60.5 KeV or higher is drawn along the shape of the spectrum. A half point 7 of the maximum point 5 of the yield of recoil hydrogen particles on the approximate straight line 6 is defined as the surface of the amorphous carbon layer. The average value of the yields of recoil hydrogen particles contained in 1-nm sections each of which corresponds to a depth of 1 nm and which are defined in the direction of the depth from the defined surface (i.e., from a depth from the surface of 0 nm) is calculated. The obtained average value of the yields of recoil hydrogen particles in the 1-nm sections is compared with average value of the yields of recoil hydrogen particles of a standard sample which has a known hydrogen content and which is treated in the same manner, and a profile was created which showed the amounts of hydrogen atoms with respect to the depth from the surface of the amorphous carbon layer. By such a processing, a profile is obtained which shows the amounts of hydrogen atoms in the 1-nm sections defined in the direction of the depth from the surface of the amorphous carbon layer over the region where the depth from the surface of the amorphous carbon layer ranges from 0 nm to 30 nm.

From the obtained profile, the average value of the amounts of hydrogen atoms in the region where the depth from the surface of the amorphous carbon layer ranges from 0 nm to 30 nm is determined. Next, the amounts of hydrogen atoms which are 1.5 times or more of this average value are eliminated from the amounts of hydrogen atoms in the 1-nm sections defined in the direction of the depth from the surface of the amorphous carbon layer in the region where the depth from the surface of the amorphous carbon layer ranges from 0 nm to 30 nm. The largest amount of hydrogen atoms of the remaining amounts of hydrogen atoms is taken as the amount of hydrogen atoms contained in the amorphous carbon layer of the present invention. The amounts of hydrogen atoms which are 1.5 times or more of the average value are eliminated because the amounts of hydrogen atoms near the surface of the amorphous carbon layer are affected by stains adhered to the surface and the like. This makes it possible to eliminate values with large errors.

Stains adhered to the surface of a measurement sample for determining the amount of hydrogen atoms exert an influence on the amount of hydrogen atoms. Hence, the surface of the measurement sample is sufficiently cleaned before the measurement. Specifically, it is preferable to conduct ultrasonic cleaning in acetone two or more times.

Density

In the present invention, the density of the amorphous carbon layer is preferably lower than 2.0 $g/cm^3$, and more preferably 1.9 $g/cm^3$ or lower. In general, an amorphous carbon layer is known to be hydrophobic and have a high contact angle of water. On the other hand, when an amorphous carbon layer is irradiated with a trace amount of ultraviolet rays for a long period, some of the carbon-carbon bonds in the amorphous carbon layer are cleaved, and carbon-oxygen bonds or carbon-hydrogen bonds are newly formed with oxygen or water. The present inventors have found that when the density of the amorphous carbon layer is lower than 2.0 $g/cm^3$, the contact angle of the amorphous carbon layer can be lowered with time. For example, when the contact angle of the amorphous carbon layer becomes lower, the water-repellent surface of the amorphous carbon layer changes to a hydrophilic one. In addition, the low contact angle leads to the improvement in wettability of a water droplet adhered to the surface. This results in decrease in amount of water contained per unit area of the water film. For this reason, the water droplet is spread thin over a wide area of the surface, and water scale becomes less noticeable. In other words, the present inventors have found that, even when water scale is formed, a stain becomes less noticeable when the density of the amorphous carbon layer is lower than a predetermined value. Accordingly, when an amorphous carbon layer in a wet area member used in an indoor wet environment has a density lower than a predetermined value, a stain can be less noticeable.

The density of the amorphous carbon layer is preferably higher than 1.1 $g/cm^3$, and more preferably 1.4 $g/cm^3$ or higher. This makes it possible to prevent the amorphous carbon layer from disappearing when used for a long period under irradiation with a trace amount of ultraviolet rays, and retain the stain release durability.

Determination of Density

In the present invention, the density of the amorphous carbon layer is determined by X-ray reflectometry (hereinafter, referred to as XRR). As measuring instruments, for example, a horizontal sample mount multi-purpose X-ray diffractometer Ultima IV (manufactured by Rigaku Corporation) or a horizontal X-ray diffractometer SmartLab (manufactured by Rigaku Corporation) can be used. Regarding the measurement conditions, Cu Kα radiation is employed, and the measuring angle is from 0.2° to 4°. Under these conditions, measurement data of X-ray scattering intensity are obtained. The density is calculated by applying data analysis software to the obtained measurement data. As the data analysis software, for example, X-ray reflectance analysis software GlobalFit Ver. 1.3.3 manufactured by Rigaku Corporation can be used. Simulation data are obtained by conducting simulation with the data analysis software by using the thickness, the density, and the interface roughness as parameters. Optimal values of these parameters are found by conducting fitting based on the least-squares method to make the values of the X-ray scattering intensity of the measurement data and those of the X-ray scattering intensity of the simulation data close to each other. Thus, the values of the thickness, the density, and the interface roughness are determined.

Note that the measurement of the density by the above-described method cannot be conducted with a sufficient precision in some cases such as a case where the surface roughness of the base member is large, a case where the base member has a wave or the like, or a case where the base member has an unsuitable shape or the like, as described later. Specifically, when the base member is made of a metal or a plastic, or has a complicated shape as in a case of a faucet or the like, it may be difficult to conduct the measurement by the above-described method with a high precision. In such a case, the density can be calculated by measuring the thickness by a method other than the above-described method, and then dividing the surface density measured by RBS "high-resolution Rutherford backscattering spectrometry" (HR-RBS) by the thickness.

Thickness of Amorphous Carbon Layer

In the present invention, the thickness of the amorphous carbon layer is preferably 4 nm or more, more preferably 5 nm or more, and further more preferably 8 nm or more. This makes it possible to obtain the stain release durability even in an environment where the amorphous carbon layer is irradiated with a trace amount of ultraviolet rays. In addition, an upper limit of the thickness of the amorphous carbon layer is not particularly specified, but is preferably 1 μm or less, further preferably 100 nm or less, and further more preferably 20 nm or less. This makes it possible to reduce the residual stress in the amorphous carbon layer and prevent the detachment of the amorphous carbon layer from the base member.

The method for measuring the thickness of the amorphous carbon layer may be the X-ray reflectometry (XRR), the reflectance spectroscopy, the X-ray photoelectron spectroscopy, the glow discharge optical emission spectroscopy, or the like. It is also possible to measure the thickness of the amorphous carbon layer by using a scanning electron microscope (SEM), a transmission electron microscope (TEM), a surface profiler, or the like. For a thin film with a thickness of 50 nm or less, the thickness is preferably measured by XRR. When XRR is employed, the thickness can be determined by the same method as the above-described method for determining the density.

Surface properties of the amorphous carbon layer can be modified by doping the amorphous carbon layer with an additional element.

The dopant element is preferably selected from elements other than titanium, chromium, aluminum, iron, nickel, copper, silver, gold, niobium, molybdenum, and tungsten. Particularly preferred elements include sulfur, nitrogen, oxygen, and the like. This makes it possible to modify the surface properties without lowering the stain release durability of the amorphous carbon layer.

Intermediate Layer

In the present invention, an intermediate layer may be present between the amorphous carbon layer and the base member. The intermediate layer preferably contains carbon, hydrogen, and silicon. The amount of silicon contained in the intermediate layer is preferably more than the amount of silicon contained in the amorphous carbon layer. The provision of the intermediate layer makes it possible to improve the adhesion between the amorphous carbon layer and the base member. Since the intermediate layer contains silicon-carbon bonds, the adhesion between the amorphous carbon layer and the intermediate layer can be improved.

Manufacturing Method

The method for forming the amorphous carbon layer may be the physical vapor deposition method (PVD method) or the chemical vapor deposition method (CVD method). The PVD method may be the sputtering method, the ion plating method, or the like. The CVD method may be the thermal CVD method, the plasma CVD method, the ionized vapor deposition method, or the like.

Plasma CVD Method

In the present invention, the amorphous carbon layer is preferably formed by the plasma CVD method.

A method for manufacturing a wet area member of the present invention is not limited to specific one, and an example thereof is the following method. Specifically, the manufacturing method of the present invention includes the steps of:

placing a base member on a base member-supporting portion provided in a container;

reducing the pressure in the container;

introducing a raw material into the container and adjusting the pressure in the container to a predetermined pressure;

generating a high-density plasma by generating a plasma from the raw material;

applying a voltage to the base member-supporting portion; and forming an amorphous carbon layer on a surface of the base member by depositing the plasma of the raw material onto the surface of the base member.

In the plasma CVD method, an amorphous carbon layer is formed in a container under reduced pressure, in general. Accordingly, the pressure in the container is reduced by using pressure reduction means. The pressure in the container is preferably reduced to 100 Pa or lower.

The raw material is introduced as a gas into the container through a raw material introduction portion. For this reason, the concentration of the raw material can be uniform over the container, and the plasma present near the surface of the base member can be placed in a uniform state. This makes it possible to reduce the variation in thickness of the amorphous carbon layer, and form an amorphous carbon layer with a uniform thickness. A raw material containing a hydrocarbon can be used. As the hydrocarbon, it is preferable to use any one or more selected from methane, ethane, propane, ethylene, acetylene, toluene, and benzene. Of these hydrocarbons, it is further preferable to use acetylene. This makes it possible to from an amorphous carbon layer which is uniform in thickness and density. In addition, the stain release property can be retained for a long period uniformly all over the wet area member. As the raw material, it is also possible to use one containing not only a hydrocarbon but also oxygen, nitrogen, or the like.

After introduction of the raw material, the pressure in the container is adjusted to a predetermined pressure by using pressure reduction means. The pressure is preferably adjusted to 100 Pa or lower.

In the present invention, it is preferable to use, as the high-density plasma, one or more selected from an inductively coupled plasma, an electron cyclotron resonance plasma, a helicon wave plasma, a surface wave plasma, a Penning ion gauge discharge plasma, and a hollow cathode discharge plasma. Of these plasmas, it is further preferable to use the inductively coupled plasma. This makes it possible to generate the high-density plasma with a simple apparatus, and form the amorphous carbon layer on a base member having a large area.

When the intermediate layer is formed between the amorphous carbon layer and the base member, the intermediate layer can be formed by using a different raw material by the same method as that for the amorphous carbon layer.

Regarding raw materials of the intermediate layer, it is possible to use one or more raw materials selected from the group consisting of hexamethyldisiloxane (HMDSO), tetramethylsilane (TMS), and silicon tetraethyloxysilane (TEOS) as a first component. In addition, it is possible to use one or more raw materials selected from the group consisting of hydrogen, oxygen, and hydrocarbons as a second component in the form of a mixture with the first component.

Pretreatment

In the present invention, a pretreatment may be conducted on the base member in forming the amorphous carbon layer or the intermediate layer on the surface of the base member. The pretreatment is conducted for the following purposes: (1) removal of adsorbed organic and inorganic substances adhered to the surface of the base member; (2) removal of the oxide layer to improve the adhesion; (3) adjustment of the surface roughness of the base member; (4) plasma activation of the surface of the base member; etc. The pretreatment may be conducted in the same process as that for forming the intermediate layer or the amorphous carbon layer or in a separate process.

In the present invention, it is preferable to conduct sputtering using Ar gas or $O_2$ gas on the base member as the pretreatment before the formation of the amorphous carbon layer or the intermediate layer.

Plasma CVD Apparatus

Figure 4:
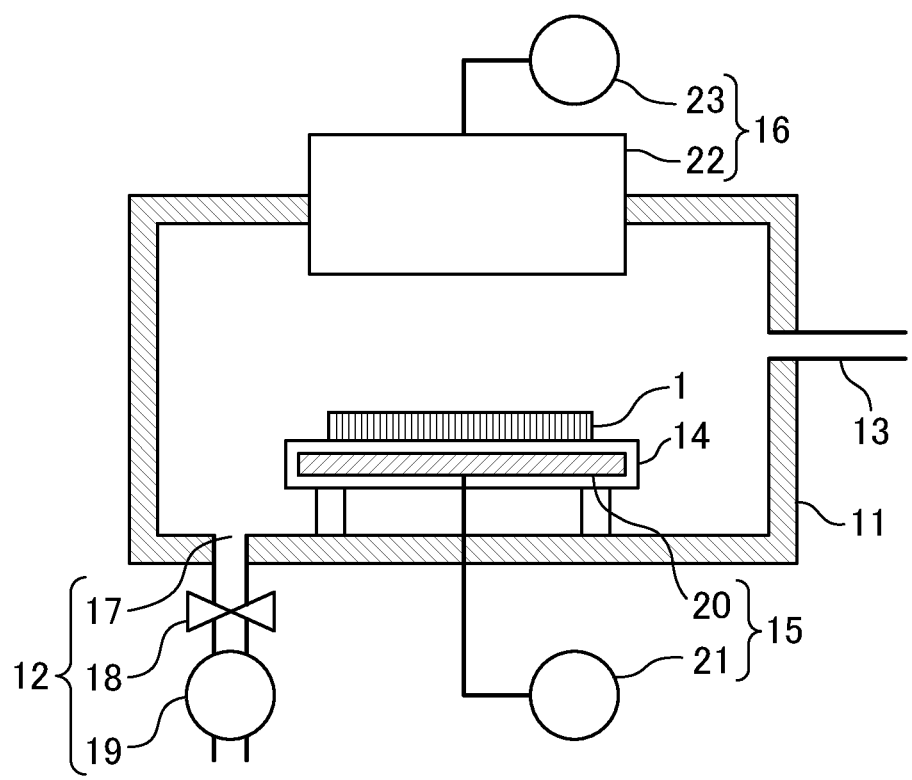
FIG. 4 is a schematic diagram showing an example of a configuration of a plasma CVD apparatus usable in the present invention.

In the plasma CVD method, a plasma CVD apparatus is used to form the amorphous carbon layer. FIG. 4 shows an example of a plasma CVD apparatus usable in the present invention. In general, the plasma CVD apparatus includes a container 11 in which an amorphous carbon layer is to be formed; pressure reduction means 12 for reducing the pressure in the container 11; a raw material introduction portion 13 through which a raw material is introduced into the container; a base member-supporting portion 14 provided in the container 11 and configured to support the base member 1; voltage application means 15 configured to apply a voltage to the base member-supporting portion 14; and high-density plasma generation means 16 for generating a high-density plasma by generating a plasma from the raw material. The amorphous carbon layer is formed on the base member 1 presumably in such a manner the plasma particles of the raw material formed in the container 11 repeatedly undergo chemical reaction with one another on the surface of the base member 1, and the resultant is deposited on the base member 1. Since the raw material is in the form of the plasma, the temperature in the container 11 can be kept at a low temperature of 200° C. or below. This allows the use of a base member made of a material with a low heat resistance such as a resin.

The pressure reduction means 12 includes a vacuum pump 19, an exhaust port 17, and a pressure adjustment means 18. The vacuum pump 19 can evacuate the gas in the container 11 to reduce the pressure, and the pressure adjustment means 18 can adjust the pressure in the container 11 to a target pressure. The pressure adjustment means 18 is one capable of adjusting the pressure in the container 11, and examples thereof include a pressure adjustment valve and the like.

The voltage application means 15 includes an electrode 20, which is a part of the base member-supporting portion 14, and a power supply 21 connected to the electrode 20. As the power supply 21, one or more selected from alternating current power supplies, direct-current power supplies, and pulse power supplies can be used. The alternating current power supplies include high-frequency power supplies. The application of a bias voltage to the electrode 20 induces an effect of attracting ions contained in the plasma to the base member 1 supported on the base member-supporting portion. This makes it possible to increase the energy of ions which collide with the base member 1. In addition, the density of the amorphous carbon layer can be increased.

In the present invention, a pulse power supply is preferably used as the power supply 21 in the above-described voltage application means 15. It is further preferable to use a high-voltage pulse power supply. By using a high-voltage pulse power supply, a high-voltage pulse voltage of 1 kV or higher is applied to an electrode plate 20. This makes it possible to increase the energy of ions which collide with the base member. Accordingly, it is possible to enhance the adhesion of the amorphous carbon layer to the base member and retain the stain release property for a long period.

The amorphous carbon layer of the present invention is preferably formed by using an apparatus including the high-density plasma generation means 16 configured to generate a high-density plasma by generating a plasma from a raw material. Since a high-density plasma is generated in the container, the amount of radicals in the plasma can be increased. The radicals are not influenced by the attraction due to the bias voltage applied to the base member-supporting portion 14, and hence can be deposited onto the base member with a low energy. Accordingly, the density of the amorphous carbon layer can be lowered by increasing the radicals in the plasma.

In the present invention, the use of the high-density plasma generation means 16 and the voltage application means 15 makes it possible to control the amount of the radicals present in the plasma and the energy of the ions each independently. This makes it possible to easily control the density of the amorphous carbon layer in a preferred range.

The high-density plasma generation means 16 is preferably one that generates, as the high-density plasma, one or more selected from an inductively coupled plasma, an electron cyclotron resonance plasma, a helicon wave plasma, a surface wave plasma, a Penning ion gauge discharge plasma, and a hollow cathode discharge plasma.

The high-density plasma generation means 16 preferably includes an antenna or electrode 22 and a power supply 23 connected to the antenna or electrode 22. For example, an inductively coupled plasma can be generated by using an antenna and a high-frequency power supply. A helicon wave plasma can be generated by using an antenna, a high-frequency power supply, and magnetic field generation means. A surface wave plasma can be generated by using an antenna, a microwave power supply, and a dielectric material. A hollow cathode discharge plasma can be generated by using an anodic electrode, a cathodic electrode facing to the anode with a space provided therebetween, and an alternating current power supply.

In the present invention, it is further preferable to use an inductively coupled plasma as the high-density plasma. This makes it possible to generate the high-density plasma with a simple apparatus and form the amorphous carbon layer on a base member with a large area.

When an inductively coupled plasma is generated, it is preferable to use an antenna and a high-frequency power supply as the high-density plasma generation means 16. It is also possible to use one in which a dielectric material is provided between an antenna and the raw material, and an electric field is applied to the raw material through the dielectric material. The inductively coupled plasma is generated, when a high-frequency current flows through the antenna, and an electric field induced by the magnetic field generated around the antenna excites the raw material. The antenna can be arranged either inside or outside the container. In the present invention, the antenna is preferably arranged inside the container. This makes it possible to efficiently apply the output from the high-frequency power supply to the raw material to generate the plasma. Hence, it is possible to generate the high-density plasma even when a high-frequency power supply with a low output is used.

EXAMPLES

Example 1

Film Formation Apparatus

A plasma CVD apparatus was used which included: a container in which an amorphous carbon layer was formed; pressure reduction means for reducing the pressure in the container; a raw material introduction portion through which a raw material was introduced into the container; a base member-supporting portion configured to support a base member; an electrode plate provided in the base member-supporting portion; a voltage application means configured to apply a voltage to the electrode plate; and high-density plasma generation means configured to generate a high-density plasma. As the high-density plasma generation means, an antenna and a high-frequency power supply were used.

Base Member

As a base member, a soda lime glass plate was used. To remove stains on the surface of the base member, washing with ion-exchanged water and washing with ethanol were conducted in this order.

Pretreatment Step

The base member was placed on the base member-supporting portion, and the pressure was reduced to a high-vacuum state (1 Pa or lower) by the pressure reduction means. Next, oxygen gas was introduced, and the pressure in the container was adjusted to 0.01 to 2.0 Pa. With a high-frequency output of 100 to 500 W at a base member temperature of 100° C. or below, a pretreatment was conducted on the base member.

Amorphous Carbon Layer Formation Step

Acetylene was used as a raw material of an amorphous carbon layer. Film formation was carried out for a predetermined treatment time with the pressure in the container being adjusted to 0.01 to 2 Pa, the output of the high-frequency power supply being adjusted to 100 to 390 W, and the voltage applied to the electrode plate being adjusted to −12 to −2 kV. Thus, an amorphous carbon layer was formed on the base member to obtain a sample of Example 1. This sample was subjected to evaluations.

Examples 2 to 6

In Examples 2 to 6, samples were obtained in the same manner as in Example 1, except that the pressure in the container, the output of the high-frequency power supply, and the voltage applied to the base member were changed within the ranges described in Example 1. These samples were subjected to evaluations.

Example 7

In Example 7, a sample was obtained in the same manner as in Example 1, except that a high-carbon chromium steel plate was used as the base member, and that the pressure in the container, the output of the high-frequency power supply, and the voltage applied to the base member were changed within the ranges described in Example 1. This sample was subjected to evaluations.

Evaluations

Determination of Amount of Hydrogen Atoms

The amount of hydrogen atoms contained in the amorphous carbon layer of each of the obtained samples was determined by the following method. First, the sample was sufficiently washed by ultrasonic cleaning in acetone two or more times to remove stains adhered to the surface. The amount of hydrogen atoms in the amorphous carbon layer was determined by ERDA. As measuring instruments, a high-resolution RBS analyzer HRBS 1000 (manufactured by KOBELCO) was used. The measurement conditions were as follows: acceleration voltage: 500 keV; ion species: nitrogen ion. The energy detection range of recoil hydrogen particles was from 38 keV to 68 keV. Under these conditions, measurement data were obtained. The obtained measurement data were expressed in a graph in which the energy of incident nitrogen ions was plotted on the horizontal axis and the yield of recoil hydrogen particles was plotted on the vertical axis. The obtained measurement data were analyzed with dedicated analysis software (analysisIB, manufactured by KOBELCO). The analysis conditions were as follows: change step size: 100; calculation times: 5000 times. The surface of the amorphous carbon layer was defined as follows. In a graph of the measurement data, an approximate straight line starting from the maximum point of the yield of recoil hydrogen particles within the region where the energy of incident nitrogen ions was 60.5 KeV or higher was drawn along the shape of the spectrum. The half point of the maximum point of the yield of recoil hydrogen particles on the approximate straight line was defined as the surface of the amorphous carbon layer. The average value of the yields of recoil hydrogen particles contained in 1-nm sections each of which corresponded to a depth of 1 nm and which were defined in the direction of the depth from the defined surface (i.e., from a depth from the surface of 0 nm) was calculated. The obtained average value of the yields of recoil hydrogen particles in the 1-nm sections was compared with the average value of the yields of recoil hydrogen particles of a standard sample which had a known hydrogen content and which was treated in the same manner, and a profile was created which showed the amounts of hydrogen atoms with respect to the depth from the surface of the amorphous carbon layer. By such a processing, a profile was obtained which showed the amounts of hydrogen atoms in the 1-nm sections defined in the direction of the depth from the surface of the amorphous carbon layer over the region where the depth from the surface of the amorphous carbon layer ranged from 0 nm to 30 nm. From the obtained profile of the amounts of hydrogen atoms, the average value of the amounts of hydrogen atoms in the region where the depth from the surface of the amorphous carbon layer ranges from 0 nm to 30 nm was determined. Next, the amounts of hydrogen atoms which were 1.5 times or more of the average value were eliminated from the amounts of hydrogen atoms in the 1-nm sections defined in the direction of the depth from the surface of the amorphous carbon layer in the region where the depth from the surface of the amorphous carbon layer ranged from 0 nm to 30 nm. The largest amount of hydrogen atoms of the remaining amounts of hydrogen atoms was taken as the amount of hydrogen atoms contained in the amorphous carbon layer. Table 1 shows the obtained results.

Determination of Density and Thickness

The density and the thickness of the amorphous carbon layer in each of the obtained samples were determined by the following method. The density and the thickness of the amorphous carbon layer were determined by XRR. As measuring instruments, a horizontal sample mount multipurpose X-ray diffractometer Ultima IV (manufactured by Rigaku Corporation) was used. Regarding the measurement conditions, Cu Kα radiation was employed, and the measuring angle was from 0.2° to 4°. Under these conditions, measurement data of X-ray scattering intensity were obtained. The density was calculated from the measurement data by using data analysis software. As the data analysis software, X-ray reflectance analysis software GlobalFit Ver. 1.3.3 manufactured by Rigaku Corporation was used. Simulation data were obtained by conducting simulation with the data analysis software by using the thickness, the density, and the interface roughness as parameters. Optimal values of the parameters were found by conducting fitting based on the least-squares method to make the values of the X-ray scattering intensity of the measurement data and those of the X-ray scattering intensity of the simulation data close to each other. Thus, the values of the thickness, the density, and the interface roughness were determined. Table 1 shows the obtained results.

Evaluation of Stain Release Property

Water scale was formed on a surface of each sample by dropping 20 µl of tap water onto the surface of the amorphous carbon layer, and allowing the sample to stand for 24 hours. The thus obtained sample on which the water scale was formed was evaluated under the following conditions. A right amount of a detergent was applied onto the surface of the amorphous carbon layer. A sponge was reciprocally slid five times on the surface of the amorphous carbon layer by using a urethane foam surface of the sponge. As the detergent, a neutral detergent for bath room cleaning was used. After that, the detergent on the sample surface was rinsed away with running water, and water was removed with a gas duster. Whether water scale remained on the sample surface was visually determined. Each sample on which no water scale remained was rated as Good, and each sample on which water scale remained was rated as Poor. Table 1 shows the results.

Evaluation of Stain Release Durability

The stain release durability was evaluated by conducting a sunshine carbon-arc weatherometer test according to JIS-A-1415 and subsequent evaluation of the appearance of each sample. An apparatus WEL-SUM-HC(H) manufactured by Suga Test Instruments Co., Ltd. was used. The lamp used was a sunshine carbon-arc lamp, and the testing time was 100 hours. In the 100 hours, a cycle of 120 minutes in total in which light irradiation was conducted for 102 minutes and then light irradiation and water spraying were conducted for 18 minutes was conducted repeatedly. After the test, the sample was subjected to the same evaluation as in "Evaluation of Stain Release Property" described above. Whether water scale remained on the sample surface was visually determined. Samples on which no water scale remained were rated as Good, whereas samples on which water scale remained were rated as Poor. Table 1 shows the results.

Evaluation of Unnoticeability of Stains

Each of the obtained samples was irradiated with ultraviolet rays, and then water scale was formed on the surface of the sample. The unnoticeability of the water scale was evaluated. First, the surface of the sample was irradiated with ultraviolet rays with an illuminance of 30 mW/cm$^2$ for 3 minutes by using a surface light-treatment apparatus PL21-200 (manufactured by SEN LIGHTS Corporation) equipped with a low-pressure mercury lamp. Water scale was formed on the surface of the sample by spreading tap water over the surface of the sample. The tap water was spread at a flow rate of 1 L/min for 1 minute once per hour. Here, one hour was taken as one cycle. After 168 cycles were carried out, the unnoticeability of the water scale was visually evaluated. Samples in which the water scale after the 168 cycles was unnoticeable were rated as Good, whereas samples in which the water scale was noticeable after the 168 cycles were rated as Poor. Table 1 shows the results.

Evaluation of Persistence of Hydrophilicity

The persistence of hydrophilicity of each of the above-described samples on which the unnoticeability of stains evaluated was evaluated by measuring the static contact angle of water. By using a light surface treatment apparatus PL21-200 (SEN LIGHTS Corporation) equipped with a low-pressure mercury lamp, the surface of the sample was irradiated with ultraviolet rays with an illuminance of 30 mW/cm$^2$ for 3 minutes. The thus obtained sample was allowed to stand in air for one week, and then the contact angle of water was measured. The static contact angle of water was measured with a contact angle meter (CA-X150, manufactured by Kyowa Interface Science Co., Ltd.). Table 1 shows the results.

Comparative Example 1

Film Formation Apparatus

A sputtering film formation apparatus was used for the film formation.

Base Member

A stainless steel plate was used as a base member. In addition, ultrasonic cleaning was conducted sequentially with ion-exchanged water and with acetone to remove stains on the surface of the base member.

Formation of Amorphous Carbon Layer

The base member was set in the container of the above-described film formation apparatus, and the pressure was reduced by the pressure reduction means to a high-vacuum state (1 Pa or lower). A solid carbon sputtering target was used as the raw material of the amorphous carbon layer. Argon gas was introduced into the container as a process gas, and the pressure in the container was adjusted. Film formation was conducted with a high-frequency output of 300 W at a base member temperature of 100° C. or below for a predetermined treatment time. Thus, an amorphous carbon layer was formed on the base member to obtain a sample.

Comparative Example 2

In Comparative Example 2, a sample was obtained by the same method as in Example 1, except that the output value of the high-frequency power supply was set to 500 W.

Comparative Example 3

In Comparative Example 3, a sample was obtained by the same method as in Example 1, except that the output value of the high-frequency power supply was set to 400 W.

Comparative Example 4: Commercially Available Product in which DLC was Formed on Glass The samples of Comparative Examples 1 to 4 were subjected to evaluation tests in the same manner as in Example 1. Table 1 shows the results.

TABLE 1

| | Base member | Amount of hydrogen atoms (atm %) | Density (g/cm$^3$) | Film thickness (nm) | Stain release property | Stain release durability | Unnoticeability of stain | Contact angle (°) |
|---|---|---|---|---|---|---|---|---|
| Example. 1 | | 21 | 1.5 | 15 | Good | Good | Good | 20 |
| Example. 2 | Glass | 33 | 1.9 | 12 | Good | Good | Good | 30 |
| Example. 3 | Glass | 33 | 1.4 | 5 | Good | Good | Good | 29 |
| Example. 4 | Glass | 32 | 1.8 | 10 | Good | Good | Good | 21 |
| Example. 5 | Glass | 35 | 1.7 | 9 | Good | Good | Good | 22 |
| Example. 6 | Glass | — | 1.7 | 20 | Good | Good | Good | — |
| Example. 7 | Glass | 32 | 1.8 | 8 | Good | Good | Good | 22 |
| Comp. Ex. 1 | Cr Plating | 3 | 2.5 | 100 | Poor | Poor | Poor | 72 |
| Comp. Ex. 2 | Cr Plating | 42 | 1.7 | 36 | Good | Poor | Good | — |
| Comp. Ex. 3 | Glass | 32 | 1.1 | 84 | Good | Poor | Good | — |
| Comp. Ex. 4 | Glass | 29 | 2.0 | 8 | Good | Good | Poor | 40 |

Reference Examples 1 and 2

In Reference Examples 1 and 2, samples were obtained in the same manner as in Example 1, except that a high-carbon chromium steel plate or a soda lime glass plate was used as the base member, and that the same pressure in the container, the same output of the high-frequency power supply, and the same voltage applied to the base member were employed between Reference Examples 1 and 2 within the ranges described in Example 1. The film thickness in each sample was measured by using surface roughness- and contour-measuring instruments (SURFCOM 1500DX manufactured by ACCRETECH). Table 2 shows the results. The results in Table 2 shows that amorphous carbon layers formed under the same conditions have the same thickness irrespective of the base member.

TABLE 2

| | Base Member | Thickness (nm) |
|---|---|---|
| Reference Example 1 | High-carbon chromium steel plate | 282 |
| Reference Example 2 | Glass | 287 |

Examples 8 and 9

In Examples 8 and 9, samples were obtained in the same manner as in Example 1, except that a stainless steel plate or a soda lime glass plate was used as the base member, and that the same pressure in the container, the same output of the high-frequency power supply, and the same voltage applied to the base member were employed between Examples 8 and 9 within the ranges described in Example 1. The samples of Examples 8 and 9 were subjected to evaluation tests in the same manner as in Example 1. Table 3 shows the results. Note that, for the sample of Example 9, it was not possible to obtain reliable data on the thickness of the amorphous carbon layer because of the influences of the wave of the base member and the like. In this respect, the thickness of the amorphous carbon layer of Example 9 was regarded as being substantially the same as the value of the thickness of the amorphous carbon layer obtained for the sample of Example 8 on the basis of the results of Reference Examples 1 and 2. In addition, the density was calculated by dividing the surface density measured by RBS "high-resolution Rutherford backscattering spectrometry" (HR-RBS) by the thickness. Based on the results of Table 3, the amount of hydrogen atoms, the density, the stain release property, the stain release durability, the unnoticeability of stain, and the contact angle were substantially the same between the obtained amorphous carbon layers formed under the same conditions, irrespective of the base member.

TABLE 3

| | Base member | Amount of hydrogen atoms (atm %) | Density (g/cm$^3$) | Film thickness (nm) | Stain release property | Stain release durability | Unnoticeability of stain | Contact angle (°) |
|---|---|---|---|---|---|---|---|---|
| Example. 8 | Cr Plating | 32 | 1.7 | 17 | Good | Good | Good | 28 |
| Example. 9 | Glass | 32 | 1.7 | 17 | Good | Good | Good | 21 |

EXPLANATION OF REFERENCE NUMERALS

1 base member
2 amorphous carbon layer
3 intermediate layer
5 maximum point of yield of recoil hydrogen particles within region where energy of incident nitrogen ions is 60.5 KeV or higher
6 approximate straight line
7 half point of maximum value of yield of recoil hydrogen particles
11 container
12 pressure reduction means
13 raw material introduction portion
14 base member-supporting portion
15 voltage application means
16 high-density plasma generation means
17 exhaust port
18 pressure adjustment means
19 vacuum pump
20 electrode
21 power supply
22 antenna or electrode
23 power supply

What is claimed is:

1. A method for inhibiting sticking of water scale to a wet area member for a long period in an indoor wet environment, the method comprising:
   forming an amorphous carbon layer on a surface of a base member to obtain the wet area member, wherein
   the amorphous carbon layer mainly contains carbon atoms and further contains hydrogen atoms, the amount of the hydrogen atoms contained in the amorphous carbon layer is more than 3 atm %, and the density of the amorphous carbon layer is lower than 2.0 g/cm$^3$.

2. The method according to claim 1, wherein
   the amount of the hydrogen atoms contained in the amorphous carbon layer is less than 42 atm %, and
   the density of the amorphous carbon layer is higher than 1.1 g/cm$^3$.

3. The method according to claim 1, wherein
   the amount of the hydrogen atoms contained in the amorphous carbon layer is 21 atm % or more and 35 atm % or less.

4. The method according to claim 1, wherein
   the density of the amorphous carbon layer is 1.4 g/cm$^3$ or higher.

5. A method for manufacturing the wet area member according to claim 1, the method comprising the steps of:
   placing a wet area base member on a base member-supporting portion provided in a container;
   reducing the pressure in the container;
   introducing a raw material into the container and adjusting the pressure in the container to a predetermined pressure;
   generating a high-density plasma by generating a plasma from the raw material;
   applying a voltage to the base member-supporting portion; and
   forming an amorphous carbon layer on a surface of the wet area base member by depositing the high-density plasma onto the surface of the wet area base member.

6. The method for manufacturing the wet area member according to claim 5, wherein
   the high-density plasma is one or more selected from an inductively coupled plasma, a surface wave plasma, a helicon wave plasma, an electron cyclotron resonance plasma, a Penning ion gauge discharge plasma, and a hollow cathode discharge plasma.

7. The method for manufacturing the wet area member according to claim 5, wherein
   the high-density plasma is an inductively coupled plasma.

8. The method of claim 1, wherein the indoor wet environment is a bath room, a washroom, a kitchen or a toilet room.

9. The method according to claim 8, wherein the wet area member is used as at least one of a mirror, a wall, a floor, a door, a window, a faucet, a water drain, a drain plug, a shower head, a shower bar, a wall of a shower booth, a handrail, a kitchen counter, a kitchen sink, a drain, a bidet toilet, a lid for a bidet toilet, and a nozzle of a bidet toilet.

10. The method according to claim 1, wherein the wet area member is used as at least one of a mirror, a wall, a floor, a door, a window, a faucet, a water drain, a drain plug, a shower head, a shower bar, a wall of a shower booth, a handrail, a kitchen counter, a kitchen sink, a drain, a bidet toilet, a lid for a bidet toilet, and a nozzle of a bidet toilet.

11. The method according to claim 1, wherein the amount of the hydrogen atoms contained in the amorphous carbon layer is 21 atm % or more and 35 atm % or less, and the density of the amorphous carbon layer is 1.4 g/cm$^3$ or higher.

* * * * *

UNITED STATES PATENT AND TRADEMARK OFFICE
CERTIFICATE OF CORRECTION

PATENT NO. : 10,029,233 B2
APPLICATION NO. : 15/049269
DATED : July 24, 2018
INVENTOR(S) : Saori Ukigai et al.

It is certified that error appears in the above-identified patent and that said Letters Patent is hereby corrected as shown below:

On the Title Page

At item (71), Line 1, "Toto, Ltd." should be -- TOTO LTD. --.

At item (72), Line 1, "Kitakyushi" should be -- Kitakyushu-shi --.

At item (72), Line 2, "Kitakyushi" should be -- Kitakyushu-shi --.

At item (72), Line 3, "Kitakyushi" should be -- Kitakyushu-shi --.

At item (72), Line 4, "Kitakyushi" should be -- Kitakyushu-shi --.

At item (72), Line 5, "Kitakyushi" should be -- Kitakyushu-shi --.

At item (72), Line 6, "Kitakyushi" should be -- Kitakyushu-shi --.

At item (72), Line 7, "Kitakyushi" should be -- Kitakyushu-shi --.

Signed and Sealed this
Twenty-first Day of May, 2019

Andrei Iancu
*Director of the United States Patent and Trademark Office*